(12) United States Patent
Kim et al.

(10) Patent No.: US 11,906,764 B2
(45) Date of Patent: Feb. 20, 2024

(54) OPTICAL FILTERS AND IMAGE SENSORS AND CAMERA MODULES AND ELECTRONIC DEVICES

(71) Applicants: Samsung Electronics Co., Ltd., Suwon-si (KR); Industry-University Cooperation Foundation Korea Aerospace University, Goyang-si (KR)

(72) Inventors: Mi Jeong Kim, Hwaseong-si (KR); Jinyoung Hwang, Goyang-si (KR); Chung Kun Cho, Suwon-si (KR); Hye Ran Kim, Hwaseong-si (KR)

(73) Assignees: Samsung Electronics Co., Ltd., Gyeonggi-do (KR); Industry-University Cooperation Foundation Korea Aerospace University, Gyeonggi-do (KR)

( * ) Notice: Subject to any disclaimer, the term of this patent is extended or adjusted under 35 U.S.C. 154(b) by 323 days.

(21) Appl. No.: 17/224,516

(22) Filed: Apr. 7, 2021

(65) Prior Publication Data
US 2021/0341658 A1 Nov. 4, 2021

(30) Foreign Application Priority Data
Apr. 29, 2020 (KR) .................. 10-2020-0052768

(51) Int. Cl.
*G02B 5/20* (2006.01)
*G02B 1/00* (2006.01)
*H01L 27/146* (2006.01)

(52) U.S. Cl.
CPC ............. *G02B 5/208* (2013.01); *G02B 1/002* (2013.01); *H01L 27/14625* (2013.01)

(58) Field of Classification Search
CPC ........ G02B 5/208; G02B 1/002; G02B 5/008; G02B 2207/101; G02B 5/281;
(Continued)

(56) References Cited

U.S. PATENT DOCUMENTS 6,353,060 B1 3/2002 Paulen et al.
6,539,333 B1 3/2003 Metelski
(Continued)

FOREIGN PATENT DOCUMENTS

JP 2007178915 A 7/2007
JP 2011253093 A 12/2011
(Continued)

OTHER PUBLICATIONS

Extended European Search Report dated Sep. 20, 2021 for corresponding European Application No. 21170214.7.

*Primary Examiner* — Jonathan Han
(74) *Attorney, Agent, or Firm* — Harness, Dickey & Pierce, P.L.C.

(57) ABSTRACT

An optical filter includes a near-infrared absorbing layer including a first material, the first material being configured to absorb light in a first wavelength spectrum belonging to a near-infrared wavelength spectrum. The optical filter includes a compensation layer adjacent to the near-infrared absorbing layer, the compensation layer including a second material different from the first material. The optical filter includes a metamaterial structure spaced apart from the near-infrared absorbing layer via the compensation layer, the metamaterial structure being configured to absorb or reflect light in a second wavelength spectrum at least partially overlapped with the first wavelength spectrum.

21 Claims, 17 Drawing Sheets

(58) Field of Classification Search
CPC .............. G02B 5/223; H01L 27/14625; H01L 27/14621; H01L 27/1462; B82Y 20/00; H04N 3/14; H04N 25/772; H04N 23/55
See application file for complete search history.

(56) References Cited

U.S. PATENT DOCUMENTS

| | | | |
|---|---|---|---|
| 7,375,803 B1 | 5/2008 | Bamji | |
| 7,420,156 B2 | 9/2008 | Kim et al. | |
| 8,655,189 B2* | 2/2014 | Almassy | G02F 1/19 |
| | | | 398/201 |
| 9,720,153 B2 | 8/2017 | Kiyoto et al. | |
| 9,900,979 B2 | 2/2018 | Sohn et al. | |
| 10,056,422 B2 | 8/2018 | Wan | |
| 10,067,270 B2* | 9/2018 | Nagao | H05K 9/0088 |
| 2010/0283086 A1 | 11/2010 | Lee et al. | |
| 2013/0071651 A1* | 3/2013 | Hakuta | B32B 17/10788 |
| | | | 428/333 |
| 2013/0258456 A1 | 10/2013 | Hashimura et al. | |
| 2015/0002928 A1* | 1/2015 | Kiyoto | C03C 17/007 |
| | | | 359/360 |
| 2017/0026590 A1 | 1/2017 | Wang et al. | |
| 2017/0146708 A1 | 5/2017 | Lah | |
| 2017/0190923 A1* | 7/2017 | Tsuruta | C09B 57/004 |
| 2017/0315270 A1* | 11/2017 | Yasuda | G02B 1/002 |
| 2018/0166592 A1 | 6/2018 | Tseng et al. | |
| 2018/0190848 A1* | 7/2018 | Ikoma | C09K 11/06 |

FOREIGN PATENT DOCUMENTS

| | | |
|---|---|---|
| JP | 2013205810 A | 10/2013 |
| JP | 2014066987 A | 4/2014 |
| JP | 3206578 U | 9/2016 |
| KR | 10-0905230 A | 7/2009 |
| KR | 10-1058861 | 8/2011 |
| KR | 10-1348254 B1 | 1/2014 |
| KR | 10-1416552 | 8/2014 |
| KR | 20160123000 A | 10/2016 |
| KR | 20170107309 A | 9/2017 |

* cited by examiner

OPTICAL FILTERS AND IMAGE SENSORS AND CAMERA MODULES AND ELECTRONIC DEVICES

CROSS-REFERENCE TO RELATED APPLICATION

This application claims priority to and the benefit of Korean Patent Application No. 10-2020-0052768 filed in the Korean Intellectual Property Office on Apr. 29, 2020, the entire contents of which are incorporated herein by reference.

BACKGROUND

1. Field

Optical filter, image sensors, camera modules, and electronic devices are disclosed.

2. Description of the Related Art

Electronic devices including an image sensor that stores an image as an electrical signal, such as cell phone, digital camera, camcorders, and cameras, have been widely used.

Electronic devices may include an optical filter in order to reduce generation of an optical distortion by light in the other regions (e.g., other wavelength spectra) than a visible light region (e.g., visible wavelength spectrum) or improve visibility by light in the other regions than a visible light region.

SUMMARY

Some example embodiments provide an optical filter capable of realizing desired optical characteristics with respect to light outside a visible light region with a thin thickness.

Some example embodiments provide an image sensor including the optical filter.

Some example embodiments provide a camera module (e.g., camera) including the optical filter or the image sensor.

Some example embodiments provide an electronic device including the optical filter, the image sensor, or the camera module.

According to some example embodiments, an optical filter includes a near-infrared absorbing layer including a first material, the first material being configured to absorb light in a first wavelength spectrum within a near-infrared wavelength spectrum, a compensation layer adjacent to the near-infrared absorbing layer, the compensation layer including a second material different from the first material, and a metamaterial structure spaced apart from the near-infrared absorbing layer via the compensation layer, the metamaterial structure being configured to absorb, reflect, and/or scatter light in a second wavelength spectrum at least partially overlapped with the first wavelength spectrum.

The metamaterial structure may not be in direct contact with the near-infrared absorbing layer.

The compensation layer may be at a lower portion, an upper portion, or a side portion of the near-infrared absorbing layer, and the metamaterial structure may be embedded in the compensation layer.

The compensation layer may surround the metamaterial structure.

The metamaterial structure surrounded by the compensation layer may be embedded in the near-infrared absorbing layer.

The second material may be not configured to absorb light in the first wavelength spectrum.

A maximum extinction coefficient (k) in a wavelength spectrum of about 700 nm to about 1200 nm of the second material may be less than about 0.01.

An average refractive index (n) in a wavelength spectrum of about 700 nm to about 1200 nm of the second material may be about 1.4 to about 2.6.

The second material may include an oxide, a nitride, an oxynitride, a halide, a sulfide, a chalcogenide, a semiconductor element, a semiconductor compound, an organic material, or any combination thereof.

A thickness of the compensation layer may be about 1.2 times to about 20 times as large as a thickness of the metamaterial structure.

A thickness ratio of a thickness of the compensation layer and a thickness of the near-infrared absorbing layer may be about 1:4 to about 1:50.

A transmission spectrum of the first material may include a first minimum transmission wavelength that is within the first wavelength spectrum and a transmission spectrum of the metamaterial structure may include a second minimum transmission wavelength that is within the second wavelength spectrum, wherein the first minimum transmission wavelength and the second minimum transmission wavelength may both be within a wavelength spectrum of about 700 nm to about 990 nm.

A difference between the first minimum transmission wavelength and the second minimum transmission wavelength may be less than or equal to about 100 nm.

A ratio of an average transmittance in the near-infrared wavelength spectrum of the optical filter to an average transmittance in a visible light wavelength spectrum of the optical filter may be less than or equal to about 0.07.

An average transmittance in a wavelength spectrum of about 430 nm to 565 nm of the optical filter may be greater than about 80%, and an average transmittance in a wavelength spectrum of about 700 nm to 800 nm or about 890 nm to 990 nm of the optical filter may be less than about 10%.

According to some example embodiments, a camera including the optical filter is provided.

According to some example embodiments, an image sensor includes a semiconductor substrate including a plurality of photodiodes and the optical filter on the semiconductor substrate.

The image sensor may further include a color filter at a lower portion of the optical filter or an upper portion of the optical filter.

According to some example embodiments, a camera including the image sensor is provided.

According to some example embodiments, an electronic device including the camera is provided.

The optical filter may effectively increase the transmittance of the light in the visible light wavelength spectrum and effectively reduce the transmittance of the light in the near-infrared wavelength spectrum with a thin thickness.

DETAILED DESCRIPTION

Figure 1:
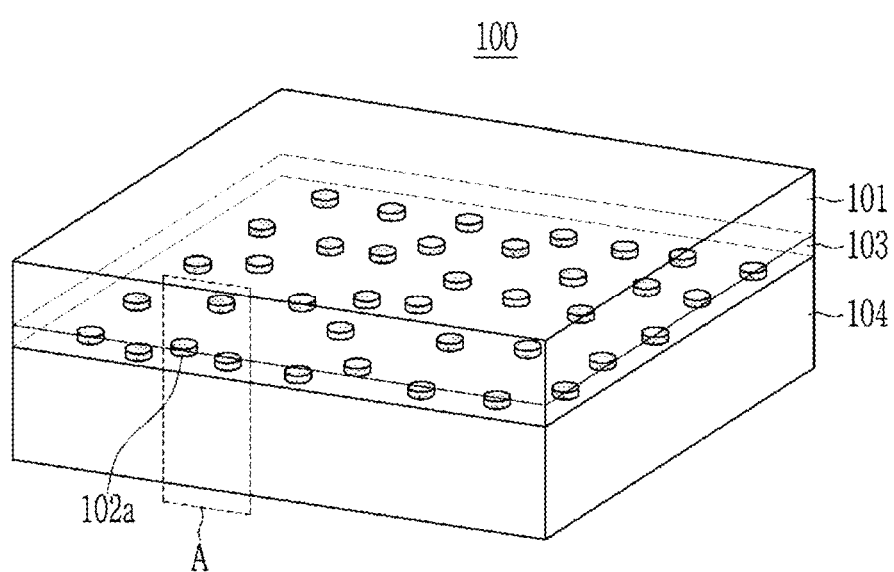
FIG. 1 is a schematic view illustrating an example of an optical filter according to some example embodiments.

Hereinafter, example embodiments of the present inventive concepts will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present such that the element and the other element are isolated from direct contact with each other by one or more interposing spaces and/or structures. In contrast, when an element is referred to as being "directly on" another element, there are no intervening elements present such that the element and the other element are in direct contact with each other. As described herein, an element that is "on" another element may be above, beneath, and/or horizontally adjacent to the other element.

It will be understood that elements and/or properties thereof may be recited herein as being "the same" or "equal" as other elements, and it will be further understood that elements and/or properties thereof recited herein as being "the same" as or "equal" to other elements may be "the same" as or "equal" to or "substantially the same" as or "substantially equal" to the other elements and/or properties thereof. Elements and/or properties thereof that are "substantially the same" as or "substantially equal" to other elements and/or properties thereof will be understood to include elements and/or properties thereof that are the same as or equal to the other elements and/or properties thereof within manufacturing tolerances and/or material tolerances. Elements and/or properties thereof that are the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Hereinafter, an optical filter according to some example embodiments is described with reference to the drawings.

The optical filter 100 according to some example embodiments may include a film or a thin film for filtering or blocking light in a particular (or, alternatively, predetermined) wavelength spectrum, for example, a film or a thin film for filtering or blocking at least a portion of light in a wavelength spectrum other than visible light, for example, a film or thin film for filtering or blocking at least some of the light in the near-infrared wavelength spectrum.

Figure 2:
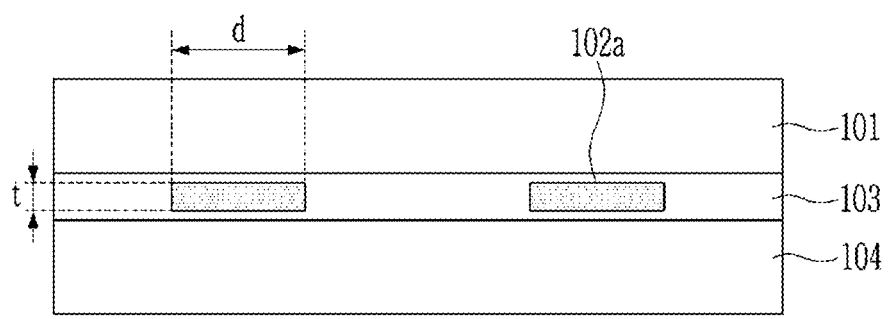
FIG. 2 is an enlarged cross-sectional view of the portion A of the optical filter of FIG. 1.
Figure 3:
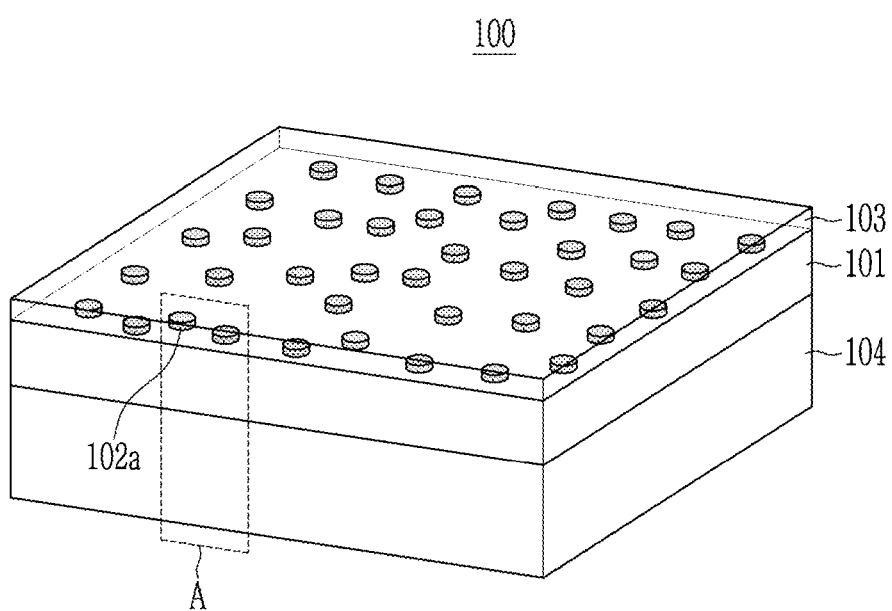
FIG. 3 is a schematic view showing another example of an optical filter according to some example embodiments.
Figure 4:
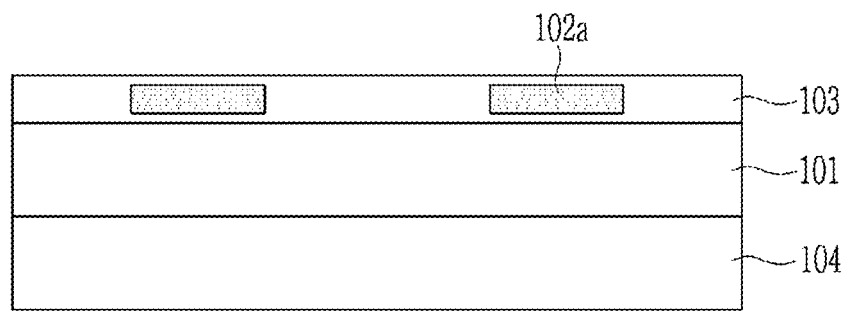
FIG. 4 is an enlarged cross-sectional view of the portion A of the optical filter of FIG. 3.
Figure 5:
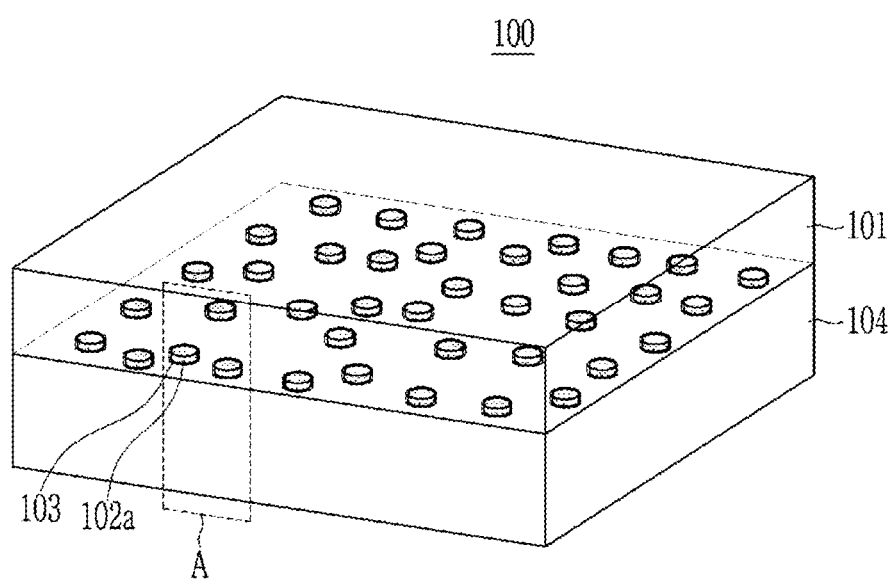
FIG. 5 is a schematic view showing another example of an optical filter according to some example embodiments.
Figure 6:
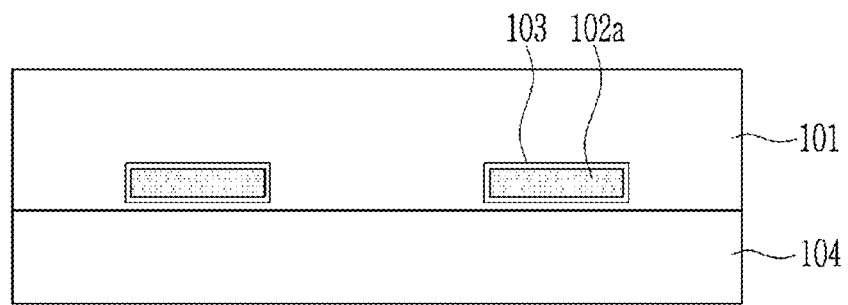
FIG. 6 is an enlarged cross-sectional view of the portion A of the optical filter of FIG. 5.
Figure 7:
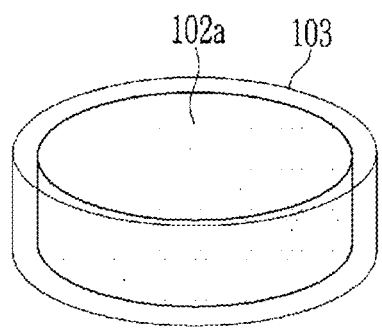
FIG. 7 is a schematic view showing a metamaterial structure capped with a compensation layer in the optical filter of FIG. 6.

FIG. 1 is a schematic view illustrating an example of an optical filter according to some example embodiments, FIG. 2 is an enlarged cross-sectional view of the portion A of the optical filter of FIG. 1, FIG. 3 is a schematic view showing another example of an optical filter according to some example embodiments, FIG. 4 is an enlarged cross-sectional view of the portion A of the optical filter of FIG. 3, FIG. 5 is a schematic view showing another example of an optical filter according to some example embodiments, FIG. 6 is an enlarged cross-sectional view of the portion A of the optical filter of FIG. 5, and FIG. 7 is a schematic view showing a metamaterial structure capped with a compensation layer in the optical filter of FIG. 6.

The optical filter 100 according to some example embodiments includes a near-infrared absorbing layer 101, metamaterial structures 102a, a compensation layer 103, and a base layer 104.

The near-infrared absorbing layer 101 includes a first material configured to absorb light in at least a portion of the near-infrared wavelength spectrum. The first material may be configured to mainly absorb light in a particular (or, alternatively, predetermined) wavelength spectrum (hereinafter referred to as a "first wavelength spectrum") belonging to (also referred to herein interchangeably as being within) the near-infrared wavelength spectrum, and the first wavelength spectrum may, for example, belong to (e.g., may be within) a wavelength spectrum of about 700 nm to about 1200 nm. For example, the first material may be a near-infrared absorbing material configured to selectively absorb light in the first wavelength spectrum belonging to the near-infrared wavelength spectrum and transmit light in a visible light wavelength spectrum.

A transmission spectrum of the first material may have (e.g., may include) a first minimum transmission wavelength ($\lambda_{min,T1}$) belonging to (e.g., within) the first wavelength spectrum by absorption of light in the first wavelength spectrum, and the first minimum transmission wavelength ($\lambda_{min,T1}$) may, for example, belong to a wavelength spectrum of about 700 nm to about 1100 nm, about 700 nm to about 1000 nm, about 700 nm to about 990 nm, about 700 nm to about 900 nm, about 700 nm to about 800 nm, about 750 nm to about 1100 nm, about 750 nm to about 1000 nm, about 750 nm to about 990 nm, about 750 nm to about 900 nm, about 750 nm to about 800 nm, about 800 nm to about 1100 nm, about 800 nm to about 1000 nm, about 800 nm to about 990 nm, about 800 nm to about 900 nm, about 850 nm to about 1100 nm, about 850 nm to about 1000 nm, about 850 nm to about 990 nm, about 850 nm to about 900 nm, about 870 nm to about 990 nm, or about 890 nm to about 990 nm.

The first material may be one or more types, and may be, for example, an organic material, an inorganic material, an organic-inorganic material, or any combination thereof. The first material may include, for example, a quantum dot, a quinoid metal complex compound, a polymethine compound, a cyanine compound, a phthalocyanine compound, a merocyanine compound, a naphthalocyanine compound, an immonium compound, a diimmonium compound, a triarylmethane compound, a dipyrromethene compound, an anthraquinone compound, a diquinone compound, a naphthoquinone compound, a squarylium compound, a rylene compound, a perylene compound, a pyrylium compound, a squaraine compound, a thiopyrylium compound, a diketopyrrolopyrrole) compound, a boron-dipyrromethene compound, a nickel-dithiol complex compound, a croconium compound, a derivative thereof, or any combination thereof, but is not limited thereto.

A (average) refractive index in visible and near-infrared wavelength spectra (e.g., about 400 nm to about 1000 nm) of the near-infrared absorbing layer 101 including the first material may be less than or equal to about 2.0 or less than or equal to about 1.8, for example about 1.1 to about 2.0 or about 1.1 to about 1.8. For example, a (average) refractive index of the near-infrared absorbing layer 101 including the first material in a wavelength spectrum of about 900 nm to about 1000 nm (e.g., 940 nm) may be less than or equal to about 2.0 or less than or equal to about 1.8, for example about 1.1 to about 2.0, or about 1.1 to about 1.8.

An (average) extinction coefficient in the visible and near-infrared wavelength spectrum (e.g., about 400 nm to about 1000 nm) of the near-infrared absorbing layer 101 including the first material may be about 0.01 to about 0.5, and for example, an (average) extinction coefficient of the near-infrared absorbing layer 101 including the first material in a wavelength spectrum of about 900 nm to 1000 nm (e.g., 940 nm) may be about 0.01 to about 0.5.

Optical characteristics of the near-infrared absorbing layer 101 may be substantially the same as optical characteristics of the first material, and that is to say, the near-infrared absorbing layer 101 may be configured to selectively absorb light in a first wavelength spectrum belonging to, for example, a wavelength spectrum of about 700 nm to about 1200 nm and may be configured to transmit light in a visible light wavelength spectrum.

A transmission spectrum of the near-infrared absorbing layer 101 may be substantially the same as a transmission spectrum of the first material, and may have a first minimum transmission wavelength ($\lambda_{min,T1}$) belonging to the first wavelength spectrum by absorption of light in the first wavelength spectrum. The first minimum transmission wavelength ($\lambda_{min,T1}$) may belong to a wavelength spectrum of, for example, about 700 nm to about 1100 nm, about 700 nm to about 1000 nm, about 700 nm to about 990 nm, about 700 nm to about 900 nm, about 700 nm to about 800 nm, about 750 nm to about 1100 nm, about 750 nm to about 1000 nm, about 750 nm to about 990 nm, about 750 nm to about 900 nm, about 750 nm to about 800 nm, about 800 nm to about 1100 nm, about 800 nm to about 1000 nm, about 800 nm to about 990 nm, about 800 nm to about 900 nm, about 850 nm to about 1100 nm, about 850 nm to about 1000 nm, about 850 nm to about 990 nm, about 850 nm to about 900 nm, about 870 nm to about 990 nm, or about 890 nm to about 990 nm.

The near-infrared absorbing layer 101 may be formed from a composition including the first material. The composition may further include a binder and/or a solvent, in addition to the first material described above.

The binder may be a transparent polymer, and is not particularly limited as long as it is a material capable of mixing with the first material, dispersing the first material, or binding the first material. The binder may be a curable binder, for example a thermally curable binder, a photocurable binder, or any combination thereof.

The binder may be, for example, (meth)acrylate, methyl cellulose, ethyl cellulose, hydroxypropyl methyl cellulose (HPMC), hydroxypropyl cellulose (HPC), a xanthan gum, polyvinyl alcohol (PVA), polyvinylpyrrolidone (PVP), a cyclic olefin polymer (COP), carboxylmethyl cellulose, hydroxyethyl cellulose, epoxy, silicone, organic-inorganic hybrid materials, a copolymer thereof, or any combination thereof, but is not limited thereto.

The first material may be included in an amount of, for example, about 0.01 to about 50 parts by weight, about 0.01 to about 30 parts by weight, about 0.01 to about 20 parts by weight, about 0.01 to about 15 parts by weight, or about 0.01 to 10 parts by weight, based on 100 parts by weight of the binder.

The near-infrared absorbing layer 101 may include a cured product of the first material and the binder.

The near-infrared absorbing layer 101 may have a thickness of about 10 nm to about 1000 nm, and within the above range, for example, about 10 nm to about 800 nm, about 10 nm to about 700 nm, about 10 nm to about 500 nm, about 10 nm to about 400 nm, or about 10 nm to about 300 nm.

The plurality of metamaterial structures 102a may be periodically or randomly arranged, and may be disposed to be spaced apart from the near-infrared absorbing layer 101 at the lower, upper, and/or inner portions of the near-infrared absorbing layer 101.

For example, referring to FIGS. 1 and 2, the plurality of metamaterial structures 102a may be disposed at the lower portion of the near-infrared absorbing layer 101, and may be disposed to be spaced apart from the near-infrared absorbing layer 101 by a compensation layer 103 that will be described later. Each metamaterial structure 102a is embedded in the compensation layer 103 and may be surrounded by the compensation layer 103.

For example, referring to FIGS. 3 and 4, the plurality of metamaterial structures 102a may be disposed at the upper portion (e.g., upper surface) of the near-infrared absorbing layer 101 and may be spaced apart from the near-infrared absorbing layer 101 by the compensation layer 103 that will be described later. Each metamaterial structure 102a may be embedded in the compensation layer 103 and may be surrounded by the compensation layer 103.

For example, referring to FIGS. 5 to 7, the plurality of metamaterial structures 102a may be disposed in the inner portion of the near-infrared absorbing layer 101, and may be spaced apart from the near-infrared absorbing layer 101 by a compensation layer 103 that will be described later. Each metamaterial structure 102a may be surrounded by the compensation layer 103, and each metamaterial structure 102a surrounded by the compensation layer 103 may be embedded in the near-infrared absorbing layer 101.

The metamaterial structures 102a are disk-shaped nanomaterials, and may be configured to absorb or scatter light of a particular (or, alternatively, predetermined) wavelength spectrum due to localized surface plasmon resonance. The metamaterial structures 102a may be for example metal nanodisks and may include for example gold (Au), silver (Ag), aluminum (Al), copper (Cu), alloys thereof, or any combination thereof, but are not limited thereto.

For example, a wavelength spectrum (hereinafter referred to as a "second wavelength spectrum") that can cause localized surface plasmon resonance may at least partially overlap with the first wavelength spectrum, which is the absorption wavelength of the near-infrared absorbing material described above, and the metamaterial structures 102a may be configured to absorb, reflect, and/or scatter light in the second wavelength spectrum. For example, the second wavelength spectrum may belong to the near-infrared wavelength spectrum. For example, the second wavelength spectrum may be narrower than the first wavelength spectrum and may fall within (e.g., may be completely encompassed within) the first wavelength spectrum. In another example, the second wavelength spectrum may be wider than the first wavelength spectrum such that the first wavelength spectrum may fall within (e.g., may be completely encompassed within) the second wavelength spectrum. In another example, the second wavelength spectrum may partially overlap with the first wavelength spectrum, such that a portion of the second wavelength spectrum is outside the first wavelength spectrum.

The second wavelength spectrum may belong to, for example, a wavelength spectrum of about 700 nm to about 1200 nm, within the range, for example about 700 nm to about 1100 nm, about 700 nm to about 1000 nm, about 700 nm to about 990 nm, about 700 nm to about 900 nm, about 700 nm to about 800 nm, about 750 nm to about 1100 nm, about 750 nm to about 1000 nm, about 750 nm to about 990 nm, about 750 nm to about 900 nm, about 750 nm to about 800 nm, about 800 nm to about 1100 nm, about 800 nm to about 1000 nm, about 800 nm to about 990 nm, about 800 nm to about 900 nm, about 850 nm to about 1100 nm, about 850 nm to about 1000 nm, about 850 nm to about 990 nm, about 850 nm to about 900 nm, about 870 nm to about 990 nm, or about 890 nm to about 990 nm.

The metamaterial structures 102a may be configured to effectively block transmission of light in the second wavelength spectrum by absorbing or scattering light belonging to the second wavelength spectrum. The transmission spectrum of the metamaterial structures 102a may have a second minimum transmission wavelength ($\lambda_{min,T2}$) belonging to the second wavelength spectrum. The second minimum transmission wavelength ($\lambda_{min,T2}$) may belong to a wavelength spectrum of about 700 nm to about 1100 nm, about 700 nm to about 1000 nm, about 700 nm to about 990 nm, about 700 nm to about 900 nm, about 700 nm to about 800 nm, about 750 nm to about 1100 nm, about 750 nm to about 1000 nm, about 750 nm to about 990 nm, about 750 nm to about 900 nm, about 750 nm to about 800 nm, about 800 nm to about 1100 nm, about 800 nm to about 1000 nm, about 800 nm to about 990 nm, about 800 nm to about 900 nm, about 850 nm to about 1100 nm, about 850 nm to about 1000 nm, about 850 nm to about 990 nm, about 850 nm to about 900 nm, about 870 nm to about 990 nm, or about 890 nm to about 990 nm.

For example, the first minimum transmission wavelength ($\lambda_{min,T1}$) of the near-infrared absorbing layer 101 and the second minimum transmission wavelength ($\lambda_{min,T2}$) of the metamaterial structures 102a may both belong to a wavelength spectrum of, for example about 700 nm to about 1100 nm, about 700 nm to about 1000 nm, about 700 nm to about 990 nm, about 700 nm to about 900 nm, about 700 nm to about 800 nm, about 750 nm to about 1100 nm, about 750 nm to about 1000 nm, about 750 nm to about 990 nm, about 750 nm to about 900 nm, about 750 nm to about 800 nm, about 800 nm to about 1100 nm, about 800 nm to about 1000 nm, about 800 nm to about 990 nm, about 800 nm to about 900 nm, about 850 nm to about 1100 nm, about 850 nm to about 1000 nm, about 850 nm to about 990 nm, about 850 nm to about 900 nm, about 870 nm to about 990 nm, or about 890 nm to about 990 nm.

For example, a difference between the first minimum transmission wavelength ($\lambda_{min,T1}$) of near-infrared absorbing layer 101 and the second minimum transmission wavelength ($\lambda_{min,T2}$) of the metamaterial structures 102a may be less than or equal to about 100 nm, for example less than or equal to about 80 nm, less than or equal to about 70 nm, less than or equal to about 50 nm, less than or equal to about 40 nm, less than or equal to about 30 nm, less than or equal to about 20 nm, or less than or equal to about 10 nm, for example 0 nm to about 100 nm, 1 nm to about 10 nm, or the like.

The metamaterial structures 102a may be three-dimensional structures of any shape and dimension configured to absorb or reflect light in the second wavelength spectrum, wherein the dimension may be a diameter (d) and a thickness (t). A dimension of the metamaterial structure 102a may be a subwavelength that is smaller than a wavelength of light to be reflected or absorbed, that is, a wavelength belonging to the second wavelength spectrum.

For example, the metamaterial structures 102a may be a thin nanobody having a flat surface, and a ratio of the diameter (d) relative to the thickness (t) of the metamaterial structures 102a may be greater than or equal to about 8, greater than or equal to about 9, greater than or equal to about 10, greater than or equal to about 12, or greater than or equal to about 15, within the ranges, about 8 to about 50, about 9 to about 50, about 10 to about 50, about 12 to about 50, or about 15 to about 50.

For example, the diameter (d) of the metamaterial structures 102a may be tens of nanometers to about hundreds of nanometers, for example greater than or equal to about 80 nm, within the ranges, for example about 80 nm to about 500 nm, about 80 nm to about 400 nm, about 80 nm to about 300 nm, or about 80 nm to about 200 nm.

For example, the thickness (t) of the metamaterial structures 102a may be several nanometers to tens of nanometers, for example less than or equal to about 60 nm, less than or equal to about 40 nm, less than or equal to about 30 nm, or less than or equal to about 20 nm, within the ranges, for example about 1 nm to about 60 nm, about 1 nm to about 50 nm, about 1 nm to about 40 nm, about 1 nm to about 30 nm, about 1 nm to about 20 nm, or about 1 nm to about 15 nm.

The metamaterial structures 102a may have a surface coverage of less than or equal to about 50% based on a total area of the optical filter 100, within the range, for example about 1% to about 50%, about 3% to about 50%, about 5% to about 50%, about 5% to about 40%, about 5% to about 30%, about 5% to about 20%, about 10% to about 50%, about 10% to about 40%, or about 10% to about 30%. The surface coverage may be an area occupied by a plurality of metamaterial structures 102a based on a total area of the optical filter 100, and may be measured by analyzing an image using an electron microscope, an atomic force microscope, or a surface analyzer.

The metamaterial structures 102a may be configured to strongly scatter light in the near-infrared wavelength spectrum by a localized surface plasmon resonance, and the scattered light may be multi-absorbed by the near-infrared absorbing layer 101 to provide a high absorbing effect for light in the near-infrared wavelength spectrum. An amount of light absorbed by the multi-absorption may be significantly higher than an amount of light absorbed when incident light from a structure without the plurality of metamaterial structures 102a, that is, a planar structure, passes through the near-infrared absorbing layer 101 once. Therefore, it is possible to produce a high light-absorbing synergy effect by a combination of the near-infrared absorbing layer 101 and the plurality of metamaterial structures 102a.

The compensation layer 103 may be disposed adjacent to the near-infrared absorbing layer 101, and may be, for example, disposed at a lower portion (e.g., lower surface) of the near-infrared absorbing layer 101 (e.g., may be beneath the near-infrared absorbing layer 101), at an upper portion (e.g., upper surface) of the near-infrared absorbing layer 101 (e.g., may be above the near-infrared absorbing layer 101), and/or at a side portion (e.g., side surface) of the near-infrared absorbing layer 101 (e.g., may be horizontally adjacent to the near-infrared absorbing layer 101). The compensation layer 103 may be a thin film stacked with the near-infrared absorbing layer 101 or a coating layer or a passivation layer surrounding each metamaterial structure 102a.

The compensation layer 103 is disposed between the near-infrared absorbing layer 101 and the metamaterial structures 102a to separate the near-infrared absorbing layer 101 and the metamaterial structures 102a, and it is possible to prevent a direct contact between the metamaterial structures 102a and the near-infrared absorbing layer 101. In some example embodiments, the metamaterial structures 102a may be at least partially in direct contact with the near-infrared absorbing layer 101 or may be not in direct contact with the near-infrared absorbing layer 101. Accordingly, the metamaterial structures 102a may be understood to be at least partially spaced apart from the near-infrared absorbing layer 101, such that the metamaterial structures 102a may or may not be isolated from direct contact with the near-infrared absorbing layer 101 via the compensation layer 103.

If, without the compensation layer 103, the near-infrared absorbing layer 101 and the metamaterial structures 102a are in direct contact, a refractive index of the near-infrared absorbing layer 101, in the main absorption wavelength spectrum, that is, the aforementioned first wavelength spectrum and the vicinity thereof may be rapidly decreased or increased by an electric field concentrated on the ends of the metamaterial structures 102a. The light-absorbing synergy effect caused by the combination of the near-infrared absorbing layer 101 and the metamaterial structures 102a may be interfered by such a change of refractive index of the near-infrared absorbing layer 101.

Therefore, by disposing the compensation layer 103 between the near-infrared absorbing layer 101 and the metamaterial structures 102a, a direct contact between the near-infrared absorbing layer 101 and the metamaterial structures 102a may be prevented, the change of the refractive index of the near-infrared absorbing layer 101 by the metamaterial structures 102a may be reduced or prevented, and the interference of the light-absorbing synergy effect by the combination of the near-infrared absorbing layer 101 and the metamaterial structures 102a may be reduced or prevented.

The compensation layer 103 may include a second material different from the first material included in the near-infrared absorbing layer 101. The second material may be, for example, a material that is not configured to substantially absorb light in the near-infrared wavelength spectrum, for example, a material that is not configured to substantially absorb and/or is not configured to absorb light in the first wavelength spectrum that is mainly absorbed by the near-infrared absorbing layer 101. For example, the second material may be a near-infrared transmission material, or a material configured to transmit light in a wavelength spectrum of at least about 700 nm to about 1200 nm without substantially absorbing it.

For example, the maximum extinction coefficient (k) in the wavelength spectrum of about 700 nm to 1200 nm of the second material may be less than about 0.01, and within the above range, less than or equal to about 0.007, less than or equal to about 0.005, less than or equal to about 0.003, less than or equal to about $1\times10^{-3}$, less than or equal to about $1\times10^{-5}$, or less than or equal to about $1\times10^{-7}$. For example, the maximum extinction coefficient (k) in the wavelength spectrum of about 700 nm to 1200 nm of the second material may be between about $1\times10^{-9}$ and about $1\times10^{-7}$, between about $1\times10^{-9}$ and about $1\times10^{-5}$, between about $1\times10^{-9}$ and about $1\times10^{-3}$, between about $1\times10^{-9}$ and about 0.003, between about $1\times10^{-9}$ and about 0.005, between about $1\times10^{-9}$ and about 0.007, between about $1\times10^{-9}$ and about 0.01, or the like.

For example, the second material may be a transparent material that is not configured to substantially absorb light in the near-infrared wavelength spectrum and visible wavelength spectrum. For example, the second material may be a visible-near infrared transmission material, and a material that is not configured to substantially absorb and configured to transmit light in a wavelength spectrum of at least about 400 nm to about 1200 nm.

For example, a maximum extinction coefficient (k) in the wavelength spectrum of about 400 nm to about 1200 nm of the second material may be less than about 0.01, within the range of less than or equal to about 0.007, less than or equal to about 0.005, less than or equal to about 0.003, less than or equal to about $1\times10^{-3}$, less than or equal to about $1\times10^{-5}$, or less than or equal to about $1\times10^{-7}$. For example, the maximum extinction coefficient (k) in the wavelength spectrum of about 400 nm to about 1200 nm of the second material may be between about $1\times10^{-9}$ and about $1\times10^{-7}$, between about $1\times10^{-9}$ and about $1\times10^{-5}$, between about $1\times10^{-9}$ and about $1\times10^{-3}$, between about $1\times10^{-9}$ and about 0.003, between about $1\times10^{-9}$ and about 0.005, between about $1\times10^{-9}$ and about 0.007, between about $1\times10^{-9}$ and about 0.01, or the like.

The refractive index of the second material may be higher or lower than the refractive index of the first material included in the near-infrared absorbing layer 101. For example, an average refractive index (n) in the wavelength spectrum of about 700 nm to about 1200 nm of the second material may be about 1.2 to about 3.0, about 1.2 to about 2.8, about 1.2 to about 2.8, or about 1.4 to about 2.6, but is not limited thereto.

For example, the refractive index of the second material may be higher than the refractive index of the first material included in the near-infrared absorbing layer 101, and the average refractive index (n) in the wavelength spectrum of about 700 nm to about 1200 nm of the second material may be about 1.01 times to about 1.5 times the average refractive index in the wavelength spectrum of about 700 nm to about 1200 nm of the first material.

For example, the refractive index of the second material may be lower than the refractive index of the first material included in the near-infrared absorbing layer 101, and the average refractive index (n) in the wavelength spectrum of about 700 nm to about 1200 nm of the second material may be about 0.70 times to about 0.99 times the average refractive index in the wavelength spectrum of about 700 nm to about 1200 nm of the first material.

The second material may be selected from an inorganic material, an organic material, an organic-inorganic material, or any combination thereof which satisfy the aforementioned physical properties, such as an oxide, a nitride, an oxynitride, a halide, a sulfide, a chalcogenide, a semiconductor element, a semiconductor compound, a photocurable polymer, a thermosetting polymer, a high heat-resistant polymer, or any combination thereof, but is not limited thereto. For example, the second material may be silicon oxide, titanium oxide, zinc oxide, indium oxide, tin oxide, indium zinc oxide, indium tin oxide, indium aluminum oxide, zirconium oxide, aluminum oxide, borosilicate, silicon nitride, silicon oxynitride, barium fluoride ($BaF_2$), calcium fluoride ($CaF_2$), lithium fluoride (LiF), magnesium fluoride ($MgF_2$), potassium chloride (KCl), potassium bromide (KBr), cesium iodide (CsI), zinc sulfide, chalcogenide, germanium, gallium arsenide, polyimide, polyvinylpyrrolidone, or any combination thereof, but is not limited thereto.

The optical characteristics of the compensation layer 103 may be substantially the same as the optical characteristics of the second material. That is, the compensation layer 103 may be configured to transmit light in the first wavelength spectrum belonging to, for example, the wavelength spectrum of about 700 nm to about 1200 nm, without absorbing it, and substantially transmit the light in the visible-infrared wavelength spectrum of the wavelength spectrum of about 400 nm to about 1200 nm, without absorbing it.

The compensation layer 103 may be formed from a composition comprising a second material. The composition may further include a binder and/or a solvent in addition to the second material described above. The binder is the same as described above.

A thickness of the compensation layer 103 may be greater than a thickness of the metamaterial structure 102a, for example, the thickness of the compensation layer 103 may be about 1.2 times or more, about 1.5 times or more, or about 2 times or more the thickness of the metamaterial structure 102a. For example, the thickness of the compensation layer 103 may be about 1.2 times to 20 times, about 1.5 times to about 20 times, or about 2 times to about 20 times the thickness of the metamaterial structure 102a, but is not limited thereto.

The thickness of the compensation layer 103 may be smaller than that of the near-infrared absorbing layer 101, for example, a thickness ratio of the compensation layer 103 and the near-infrared absorbing layer 101 may be about 1:2 to about 1:100. For example, the thickness ratio of the thickness of the compensation layer 103 to the thickness of the near-infrared absorbing layer 101 may be about 1:3 to about 1:80, about 1:4 to about 1:50, or about 1:4 to about 1:30, but is not limited thereto.

The base layer 104 may be disposed under the near-infrared absorbing layer 101, metamaterial structures 102a, and compensation layer 103, so that it may support the near-infrared absorbing layer 101, metamaterial structures 102a, and compensation layer 103. The base layer 104 may be a transparent base layer, and may have a transmittance of greater than or equal to about 85%, greater than or equal to about 90%, or greater than or equal to about 95% in a wavelength spectrum of about 400 nm to about 1000 nm.

The base layer 104 may include an organic material, an inorganic material, an organic-inorganic material or any combination thereof, for example oxide, nitride, sulfide, fluoride, polymer or any combination thereof, for example glass, silicon oxide, aluminum oxide, magnesium fluoride, polystyrene, polymethylmethacrylate, polycarbonate, or any combination thereof, but is not limited thereto.

As described above, the optical filter 100 may exhibit high light absorption characteristics for light in the near-infrared wavelength spectrum at a thin thickness by the combination of the near-infrared absorbing layer 101 and the plurality of metamaterial structures 102a. Specifically, the optical filter 100 may be configured to scatter light in the near-infrared wavelength spectrum by a localized surface plasmon resonance generated in the plurality of metamaterial structures 102a, and the scattered light may be multi-absorbed by the near-infrared absorbing layer 101 to exhibit a high absorbing effect for light in the near-infrared wavelength spectrum. An amount of light absorbed by the multi-absorption may be significantly higher than an amount of light absorbed when incident light from a structure without the plurality of metamaterial structures 102a, that is, a planar structure, passes through the near-infrared absorbing layer 101 once. Therefore, it is possible to produce a high light-absorbing synergy effect by a combination of the near-infrared absorbing layer 101 and the plurality of metamaterial structures 102a.

On the other hand, as described above, by disposing the compensation layer 103 between the near-infrared absorbing layer 101 and the metamaterial structures 102a, a direct contact between the near-infrared absorbing layer 101 and the metamaterial structures 102a may be prevented, and the change of the refractive index of the near-infrared absorbing layer 101 by the metamaterial structures 102a may be prevented, thereby reducing or preventing hindrance of the light-absorbing synergy effect caused by the combination of the near-infrared absorbing layer 101 and the metamaterial structures 102a.

A transmission spectrum of the optical filter 100 may have a wider wavelength spectrum width than the first wavelength spectrum absorbing in the near-infrared absorbing layer 101 and the second wavelength spectrum absorbing or scattering in the metamaterial structures 102a, respectively, while respectively overlapped with the first wavelength spectrum and the second wavelength spectrum. For example, the transmission spectrum of the optical filter 100 may have a wavelength spectrum width of greater than or equal to about 100 nm within the range, greater than or equal to about 120 nm, greater than or equal to about 140 nm, greater than or equal to about 150 nm, greater than or equal to about 180 nm, greater than or equal to about 200 nm, greater than or equal to about 210 nm, greater than or equal to about 220 nm, greater than or equal to about 230 nm, greater than or equal to about 240 nm, or greater than or equal to about 250 nm, or about 100 nm to about 300 nm, about 120 nm to about 300 nm, about 140 nm to about 300 nm, about 150 nm to about 300 nm, about 180 nm to about 300 nm, about 200 nm to about 300 nm, about 210 nm to about 300 nm, about 220 nm to about 300 nm, about 230 nm to about 300 nm, about 240 nm to about 300 nm, or about 250 nm to about 300 nm, at a transmittance of 50%. Accordingly, the optical filter 100 may exhibit high light absorption characteristics over a wide wavelength spectrum width in the near-infrared wavelength spectrum.

On the other hand, the optical filter 100 may increase a transmittance of light in the visible wavelength spectrum by combining the near-infrared absorbing layer 101 and the metamaterial structures 102a compared with a case of including the near-infrared absorbing layer 101 alone or the metamaterial structures 102a alone.

Accordingly, the optical filter 100 may increase a transmittance of light in the visible wavelength spectrum and absorbance in the near-infrared wavelength spectrum and thus much further increase an effect of selectively filtering the near-infrared wavelength spectrum.

For example, an average transmittance ($T_{VIS}$) in the visible wavelength spectrum of the optical filter 100 (e.g., an average transmittance of the optical filter in a wavelength spectrum of about 430 nm to 565 nm) may be greater than about 80%, and within the range, greater than or equal to about 82%, greater than or equal to about 85%, greater than or equal to about 90%, greater than or equal to about 91%, greater than or equal to about 92%, greater than or equal to about 94%, greater than or equal to about 95%, greater than or equal to about 96%, greater than or equal to about 97%, greater than or equal to about 98%, or greater than or equal to about 99%. Herein, the visible wavelength spectrum may be for example a particular wavelength spectrum belonging to a range of greater than or equal to about 400 nm and less than about 700 nm or about 430 nm to about 565 nm.

For example, the average transmittance ($T_{NIR}$) in the near-infrared wavelength spectrum of the optical filter 100 (e.g., an average transmittance of the optical filter in a wavelength spectrum of about 700 nm to 800 nm or about 890 nm to 990 nm) may be lower than the case of having the near-infrared absorbing layer 101 alone or the metamaterial structures 102a alone, for example, may be lower about 1.5 times or more, about twice or more, about 3 times or more, about 4 times or more, or about 5 times or more, for example, about 1.5 times to about 50 times, about twice to about 50 times, about 3 times to about 50 times, about 4 times to about 50 times, or about 5 times to about 50 times. The average transmittance ($T_{NIR}$) in the near-infrared wavelength spectrum of the optical filter 100 may be for example less than about 10%, and within the range, less than or equal to about 8%, less than or equal to about 7%, less than or equal to about 5%, less than or equal to about 4%, less than or equal to about 3%, less than or equal to about 2%, less than or equal to about 1%, or less than or equal to about 0.5%, and each of these ranges may be greater than or equal to about 0.01%. Herein, the near-infrared wavelength spectrum may be for example a particular wavelength spectrum belonging to about 700 nm to about 1200 nm, about 700 nm to about 800 nm, or about 890 nm to about 990 nm.

For example, a ratio ($T_{NIR}/T_{VIS}$) of the average transmittance in the near-infrared wavelength spectrum of the optical filter 100 to the average transmittance in the visible-wavelength spectrum of the optical filter 100 may be lower compared with the case of having the near-infrared absorbing layer 101 alone or the metamaterial structures 102a alone, respectively, for example, may be lower about 1.5 times or more, about twice or more, about 3 times or more, about 4 times or more, or about 5 times or more, for example, about 1.5 times to about 50 times, about twice to about 50 times, about 3 times to about 50 times, about 4 times to about 50 times, or about 5 times to about 50 times. The ratio ($T_{NIR}/T_{VIS}$) of the average transmittance in the near-infrared wavelength spectrum to the average transmittance in the visible-wavelength spectrum of the optical filter 100 may be, for example, less than or equal to about 0.1, and within the range, less than or equal to about 0.08, less than or equal to about 0.07, less than or equal to about 0.05, less than or equal to about 0.04, less than or equal to about 0.03, or less than or equal to about 0.02, and each of these ranges may be greater than or equal to about 0.01.

The optical filter 100 may be applied to all applications for filtering light of a particular (or, alternatively, predetermined) wavelength spectrum, and may be effectively applied as a near-infrared cut filter to filter light in a near-infrared wavelength spectrum. The optical filter 100 may be usefully applied to an electronic device including for example an image sensor, a camera module, and the like. The electronic device may be a digital camera, a camcorder, a monitoring camera such as CCTV, an in-car camera, a robot camera, a medical camera, a cell phone having a built-in or external camera, a computer having a built-in or external camera, a laptop computer having a built-in or external camera, and the like, but is not limited thereto.

Hereinafter, an example of a camera module (e.g., camera) provided with the aforementioned optical filter 100 is described.

Figure 8:
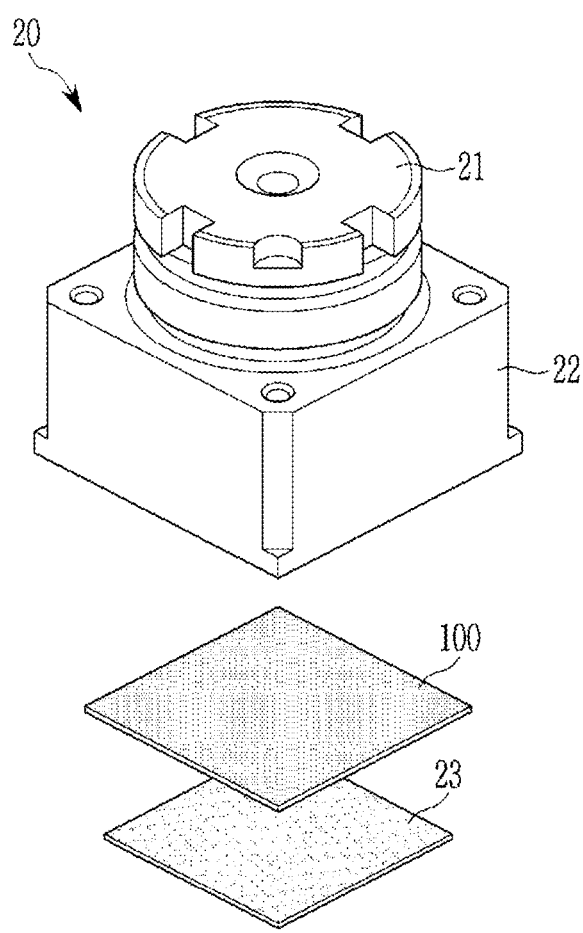
FIG. 8 is a schematic view showing an example of a camera module according to some example embodiments.

FIG. 8 is a schematic view showing an example of a camera module according to some example embodiments.

Referring to FIG. 8, a camera module 20 (also referred to herein as a camera) includes a lens barrel 21, a housing 22, an optical filter 100, and an image sensor 23.

The lens barrel 21 includes at least one lens imaging a subject, and the lens may be disposed along an optical axis direction. Herein, the optical axis direction may be a vertical direction of the lens barrel 21. The lens barrel 21 is internally housed in the housing 22 and united with the housing 22. The lens barrel 21 may be moved in optical axis direction inside the housing 22 for autofocusing.

The housing 22 supports and houses the lens barrel 21 and the housing 22 may be open in the optical axis direction or may be designed vertically using prisms or the like. Accordingly, incident light entered into the housing 22 may reach the image sensor 23 through the lens barrel 21 and the optical filter 100.

The housing 22 may be equipped with an actuator for moving the lens barrel 21 in the optical axis direction. The actuator may include a voice coil motor (VCM) including a magnet and a coil. However, various methods such as a mechanical driving system or a piezoelectric driving system using a piezoelectric device except for the actuator may be adopted.

The optical filter 100 is the same as described above.

The image sensor 23 may concentrate an image of a subject and thus store it as data, and the stored data may be displayed as an image through a display media.

The image sensor 23 may be mounted in a substrate (not shown) and electrically connected to the substrate. The substrate may be, for example, a printed circuit board (PCB) or electrically connected to a printed circuit board, and the printed circuit board may be, for example, a flexible printed circuit board (FPCB).

The image sensor 23 may concentrate light passing the lens barrel 21 and the optical filter 100 and generate a video signal and may be a complementary metal-oxide semiconductor (CMOS) image sensor and/or a charge coupled device (CCD) image sensor.

Figure 9:
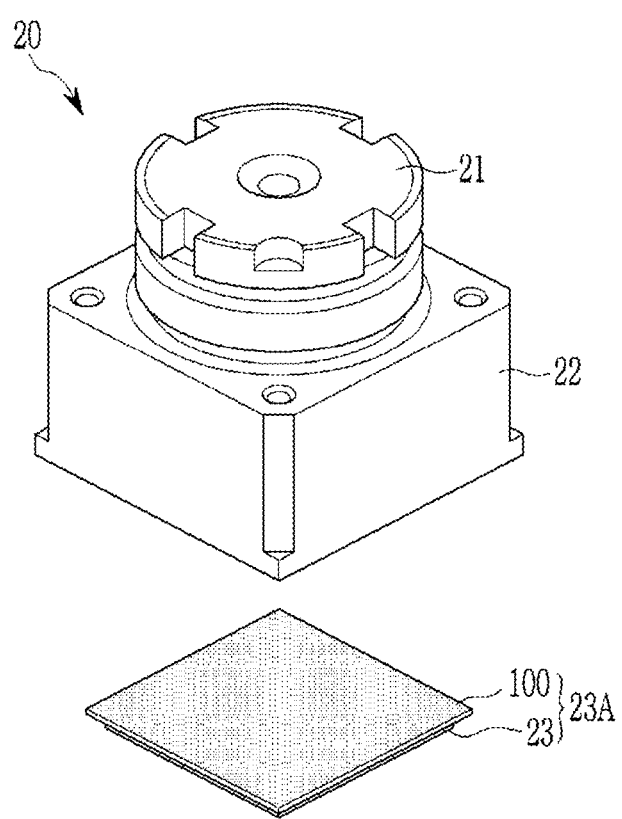
FIG. 9 is a schematic view showing another example of a camera module according to some example embodiments.

FIG. 9 is a schematic view showing another example of a camera module according to some example embodiments.

Referring to FIG. 9, a camera module 20 according to some example embodiments includes the lens barrel 21, the housing 22, the optical filter 100, and the image sensor 23, like some example embodiments, including the example embodiments shown in FIG. 8.

However, in the camera module 20 according to some example embodiments, including the example embodiments shown in FIG. 9, the optical filter 100 and the image sensor 23 may be in contact with each other, for example the optical filter 100 and the image sensor 23 may be integrally formed to provide an optical filter-integrated image sensor 23A, unlike some example embodiments, including the example embodiments shown in FIG. 8.

Hereinafter, an example of an optical filter-integrated image sensor 23A is described with reference to a drawing. As an example of an image sensor, a CMOS image sensor is described.

Figure 10:
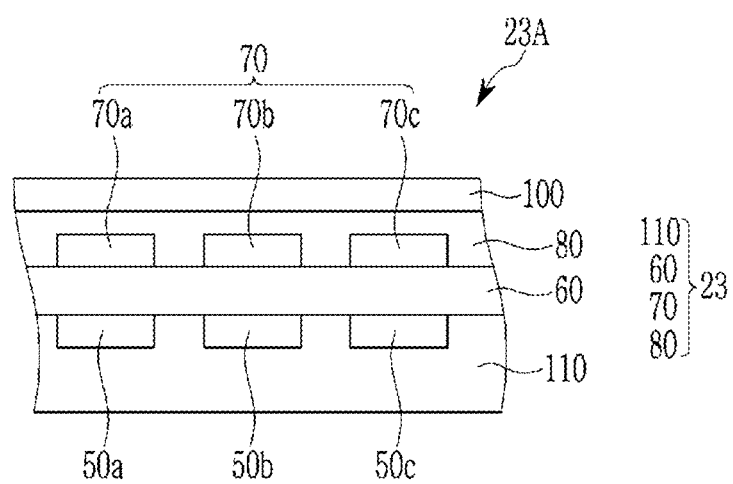
FIG. 10 is a cross-sectional view showing an example of an optical filter-integrated image sensor according to some example embodiments.

FIG. 10 is a cross-sectional view showing an example of an optical filter-integrated image sensor according to some example embodiments.

The optical filter-integrated image sensor 23A according to some example embodiments includes an image sensor 23 including a semiconductor substrate 110, a lower insulation layer 60, a color filter layer 70 and an upper insulation layer 80; and an optical filter 100.

The semiconductor substrate 110 may be a silicon substrate, and is integrated with (e.g., includes) the photo-sensing devices 50*a*, 50*b*, and 50*c*, and transmission transistor (not shown). The photo-sensing devices 50*a*, 50*b*, and 50*c* may be photodiodes. For example, the photo-sensing device 50*a* may be a blue photo-sensing device 50*a* configured to sense light in a blue wavelength spectrum which passes a blue filter 70*a* described later, the photo-sensing device 50*b* may be a green photo-sensing device 50*b* configured to sense light in a green wavelength spectrum which passes a green filter 70*b* described later, and the photo-sensing device 50*c* may be a red photo-sensing device 50*c* configured to sense light in a red wavelength spectrum which passes a red filter 70*c* described later. The photo-sensing devices 50*a*, 50*b*, and 50*c* and the transmission transistor may be integrated in each pixel. The photo-sensing devices 50*a*, 50*b*, and 50*c* may sense light and the sensed information may be transferred by the transmission transistor.

A metal wire (not shown) and a pad (not shown) are formed on the semiconductor substrate 110. In order to decrease signal delay, the metal wire and pad may be made of a metal having low resistivity, for example, aluminum (Al), copper (Cu), silver (Ag), and alloys thereof, but is not limited thereto. However, it is not limited to the structure, and the metal wire and pad may be disposed under the photo-sensing devices 50*a*, 50*b*, and 50*c*.

The lower insulation layer 60 is formed on the metal wire and the pad. The lower insulation layer 60 may be made of an inorganic insulating material such as a silicon oxide and/or a silicon nitride, or a low dielectric constant (low K) material such as SiC, SiCOH, SiCO, and SiOF.

A color filter layer 70 is formed on the lower insulation layer 60. The color filter layer 70 includes a blue filter 70*a* formed in a blue pixel, a green filter 70*b* formed in a green pixel, and a red filter 70*c* formed in a red pixel. However, the present disclosure is not limited thereto, but at least one of the blue filter 70*a*, the green filter 70*b*, or the red filter 70*c* may be replaced by a yellow filter, a cyan filter, or a magenta filter.

The upper insulation layer 80 is formed on the color filter layer 70. The upper insulation layer 80 may provide a flat surface by reducing stepped portions formed by the color filter layer 70. The upper insulation layer 80 may be made of an inorganic insulating material such as silicon oxide and/or silicon nitride or an organic insulating material. The upper insulation layer 80 may be omitted as needed.

The optical filter 100 is formed on the upper insulation layer 80. The optical filter 100 includes the near-infrared absorbing layer 101, the plurality of metamaterial structures 102*a*, the compensation layer 103, and the base layer 104 as described above, and may for example effectively transmit light in a visible wavelength spectrum and effectively filter or block light in the other regions than a visible light region, like a near-infrared wavelength spectrum. When the aforementioned upper insulation layer 80 is the same as the base layer 104 of the optical filter 100, any one of the upper insulation layer 80 and the base layer 104 may be omitted. Detailed descriptions of the optical filter 100 are as described above.

Focusing lens (not shown) may be further formed on the optical filter 100. However, the present disclosure is not limited thereto, and the optical filter 100 may be disposed on the focusing lens. The focusing lens may control a direction of incident light and gather the light in one region. The focusing lens may have a shape of, for example, a cylinder or a hemisphere, but is not limited thereto.

A dual bandpass filter (not shown) may be disposed under the focusing lens. The dual bandpass filter may selectively transmit light in at least two wavelength spectra of incident light and may for example selectively transmit light in a visible wavelength spectrum and in a near-infrared wavelength spectrum.

As described above, the optical filter 100 may be configured to effectively transmit light in the visible light region and effectively block light in the near-infrared wavelength spectrum and thus transfer pure light in the visible light region to the image sensor and accordingly, reduce or prevent a crosstalk generated when a signal by light of the visible light region is crossed and mingled with another signal by light of the near-infrared wavelength spectrum.

Particularly, the optical filter 100 may have a thin thickness of less than or equal to about 10 μm, less than or equal to about 5 μm, less than or equal to about 3 μm, less than or equal to about 2 μm, less than or equal to about 1 μm, less than or equal to about 700 nm, about 10 nm to about 10 μm, about 10 nm to about 5 μm, about 10 nm to about 3 μm, about 10 nm to about 2 μm, about 10 nm to about 1 μm, or about 10 nm to about 700 nm, and thus the optical filter 100 and the image sensor 23 may be realized into an integrated image sensor 23A, and accordingly, may realize thinness of an image sensor, a camera module, and an electronic device equipped therewith.

Figure 11:
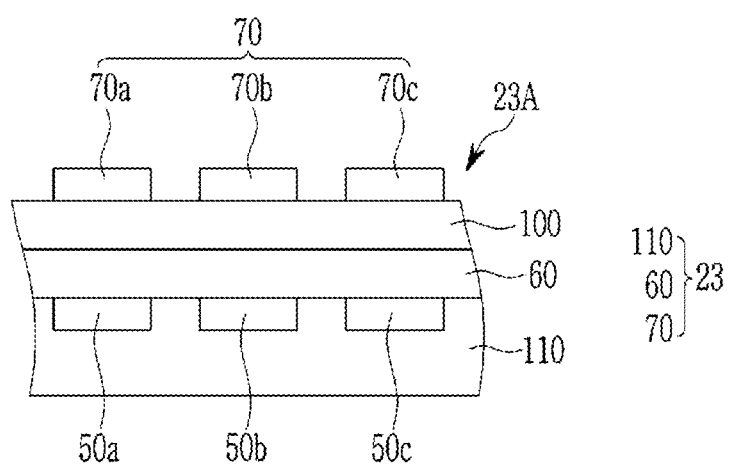
FIG. 11 is a cross-sectional view showing another example of an optical filter-integrated image sensor according to some example embodiments.

FIG. 11 is a cross-sectional view showing another example of an optical filter-integrated image sensor according to some example embodiments.

According to some example embodiments, an optical filter-integrated image sensor 23A includes an image sensor 23 including the semiconductor substrate 110 integrated with photo-sensing devices 50*a*, 50*b*, and 50*c*; the lower insulation layer 60; and the color filter layer 70; and the optical filter 100, like some example embodiments, including the example embodiments shown in FIG. 10.

However, according to some example embodiments, including the example embodiments shown in FIG. 11, in the integrated image sensor 23A, the optical filter 100 is disposed under the color filter layer 70, unlike some example embodiments, including the example embodiments shown in FIG. 10. Accordingly, in some example embodiments, the color filter layer 70, including one or more color filters, may be at a lower portion or lower surface of the optical filter 100 such that the color filter layer 70 is between the optical filter 100 and the semiconductor substrate 110 (e.g., as shown in FIG. 10) or may be at an upper portion or upper surface of the optical filter 100 such that the optical filter 100 is between the color filter layer 70 and the semiconductor substrate 110 (e.g., as shown in FIG. 11). In the drawing, the optical filter 100 is illustrated as an example with a structure in which the optical filter 100 is disposed between the lower insulation layer 60 and the color filter layer 70. However, the present disclosure is not limited thereto and the optical filter 100 may be disposed between the semiconductor substrate 110 and the lower insulation layer 60. When the lower insulation layer 60 is the same as the base layer 104 of the optical filter 100, any one of the lower insulation layer 60 and the base layer 104 of the optical filter 100 may be omitted.

Figure 12:
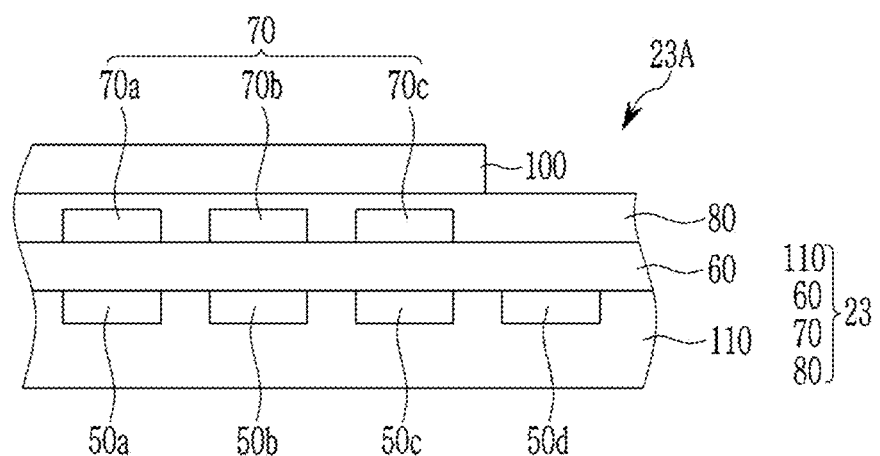
FIG. 12 is a cross-sectional view showing another example of an optical filter-integrated image sensor according to some example embodiments.

FIG. 12 is a cross-sectional view showing another example of an optical filter-integrated image sensor according to some example embodiments.

According to some example embodiments, including the example embodiments shown in FIG. 12, an optical filter-integrated image sensor 23A includes an image sensor 23 including the semiconductor substrate 110 integrated with photo-sensing device 50a, 50b, and 50c; the lower insulation layer 60; the color filter layer 70; and the upper insulation layer 80; and the optical filter 100, like some example embodiments, including the example embodiments shown in FIG. 10.

However, according to some example embodiments, including the example embodiments shown in FIG. 12, the optical filter-integrated image sensor 23A may include the photo-sensing device 50d for sensing light belonging to the infrared wavelength spectrum additionally integrated in the semiconductor substrate 110, unlike some example embodiments, including the example embodiments shown in FIG. 10. The color filter layer 70 may include a visible light cut filter, a transparent filter or a white color filter (not shown) at the position corresponding to the photo-sensing device 50d or just have an empty space without a particular filter.

The optical filter 100 may be disposed either at an upper portion (e.g., upper surface) alone or a lower portion (e.g., lower surface) alone of the blue filter 70a, the green filter 70b, and the red filter 70c but neither at an upper portion nor lower portion (e.g., neither at an upper surface nor lower surface) of the transparent filter or the white color filter.

For example, the photo-sensing device 50d may be used as an auxiliary device for telephoto cameras to improve the sensitivity of the image sensor in low-illumination environments or to sharpen faint visible light images caused by fog or fine dust.

For example, the photo-sensing device 50d may be used as an infrared sensor configured to sense light in a near-infrared wavelength spectrum. The infrared sensor may extend a dynamic range specifically classifying a black/white contrast and thus increase sensing capability of a long distance 3-dimensional image. The infrared sensor may be for example a biometric sensor, for example an iris sensor, a depth sensor, a fingerprint sensor, a blood vessel distribution sensor, but is not limited thereto.

Figure 13:
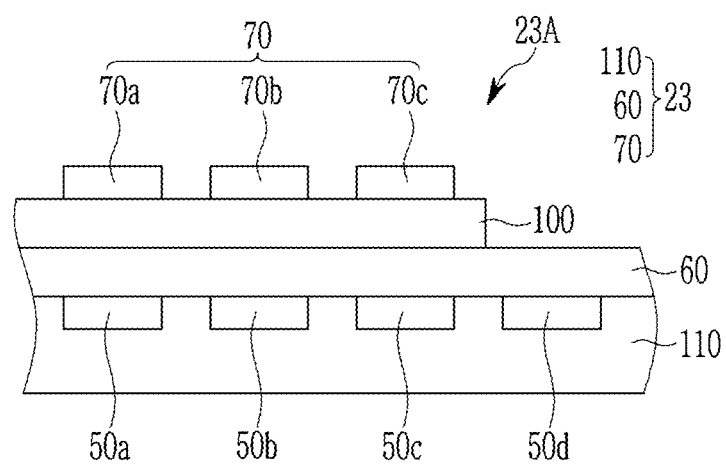
FIG. 13 is a cross-sectional view showing another example of an optical filter-integrated image sensor according to some example embodiments.

FIG. 13 is a cross-sectional view showing another example of an optical filter-integrated image sensor according to some example embodiments.

According to some example embodiments, including the example embodiments shown in FIG. 13, an optical filter-integrated image sensor 23A includes an image sensor 23 including the semiconductor substrate 110 integrated with photo-sensing devices 50a, 50b, 50c, and 50d, the lower insulation layer 60, and the color filter layer 70; and the optical filter 100, like some example embodiments, including the example embodiments shown in FIG. 12.

However, according to some example embodiments, including the example embodiments shown in FIG. 13, in the optical filter-integrated image sensor 23A, the optical filter 100 is disposed under the color filter layer 70, unlike some example embodiments, including the example embodiments shown in FIG. 12. In the drawing, the optical filter 100 is illustrated as an example with a structure in which the optical filter 100 is disposed between the lower insulation layer 60 and the color filter layer 70. However, the present disclosure is not limited thereto and the optical filter 100 may be disposed between the semiconductor substrate 110 and the lower insulation layer 60. When the lower insulation layer 60 is the same as the base layer 104 of the optical filter 100, any one of the lower insulation layer 60 and the base layer 104 of the optical filter 100 may be omitted.

Figure 14:
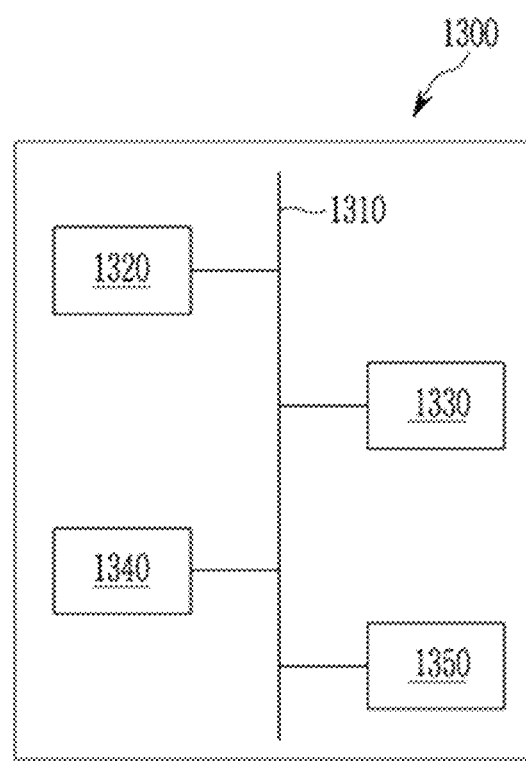
FIG. 14 is a schematic diagram of an electronic device according to some example embodiments.

FIG. 14 is a schematic diagram of an electronic device according to some example embodiments.

Referring to FIG. 14, an electronic device 1300 includes a processor 1320, a memory 1330, a sensor 1340, and a display device 1350 electrically connected through a bus 1310. The sensor 1340 may be any of the aforementioned various image sensors (e.g., 23, 23A), cameras (e.g., 20), any combination thereof, or the like, and may include any of the example embodiments of optical filters 100. The processor 1320 may perform a memory program and thus at least one function, including controlling the sensor 1340. The processor 1320 may additionally perform a memory program and thus display an image on the display device 1350. The processor 1320 may generate an output.

Hereinafter, some example embodiments are illustrated in more detail with reference to examples. However, the present scope of the inventive concepts is not limited to these examples.

Design of Optical Filter I

Example 1

A 50 nm-thick high refractive index layer (refractive index: 1.65) is manufactured on a glass substrate, a plurality of Ag nanodisks having a diameter of 132 nm and a thickness of 10 nm are disposed thereon with a surface coverage of 20%, and a 50 nm-thick high refractive index layer (refractive index: 1.65) is manufactured thereon to form a 100 nm-thick compensation layer in which the plurality of Ag nanodisks are embedded. Subsequently, a composition in which 15 wt % of a near-infrared absorbing material (Epolin, Epolight™ 1178) and 85 wt % of a cycloolefin polymer (poly[[octahydro-5-(methoxycarbonyl)-5-methyl-4,7-methano-1H-indene-1,3-diyl]-1,2-ethanediyl], Sigma-Aldrich, CAS No. 123322-60-1) are blended in chloroform is spin-coated (3000 rpm, 20 seconds) on the compensation layer to form an about 400 nm-thick near-infrared absorbing layer, designing an optical filter (structures of FIGS. 1 and 2).

The average refractive index (n) and the maximum extinction coefficient (k) in the visible and near-infrared wavelength range (400 nm to 1000 nm) of the compensation layer are 1.65 and 0, respectively.

The average refractive index (n) and the maximum extinction coefficient (k) in the visible and near-infrared wavelength range (400 nm to 1000 nm) of the near-infrared absorption layer are 1.47 and 0.16, respectively.

A refractive index and the extinction coefficient are obtained from a polarized light characteristic change (Delta, Psi) by using an Ellipsometry equipment (J.A.Woollam Co.).

Example 2

An optical filter is designed in the same manner as in Example 1, except that the surface coverage of the plurality of Ag nanodisks is changed to 19%.

Example 3

An optical filter is designed in the same manner as in Example 1, except that the surface coverage of the plurality of Ag nanodisks is changed to 18%.

Comparative Example 1 a composition in which 15 wt % of a near-infrared absorbing material (Epolin, Epolight™ 1178) and 85 wt % of a cycloolefin polymer (poly[[octahydro-5-(methoxycarbonyl)-5-methyl-4,7-methano-1H-indene-1,3-diyl]-1,2-ethanediyl), Sigma-Aldrich, CAS No. 123322-60-1) are blended in chloroform is spin-coated (3000 rpm, 20 seconds) on a glass substrate without a plurality of Ag nanodisks and a compensation layer to form an about 500 nm-thick near-infrared absorbing layer, designing an optical filter.

Comparative Example 2

A plurality of Ag nanodisks having a diameter of 132 nm and a thickness of 10 nm are disposed on a glass substrate without a near-infrared absorbing layer and a compensation layer at a surface coverage of 20%, and a cycloolefin polymer (poly[[octahydro-5-(methoxycarbonyl)-5-methyl-4,7-methano-1H-indene-1,3-diyl]-1,2-ethanediyl], Sigma-Aldrich, CAS No. 123322-60-1) solution is spin-coated (3000 rpm, 20 seconds) to form an about 500 nm-thick polymer layer, designing an optical filter.

Reference Example 1

A plurality of Ag nanodisks having a diameter of 160 nm and a thickness of 10 nm are disposed on a glass substrate without a compensation layer, with a surface coverage of 20%. A composition in which 15 wt % of a near-infrared absorbing material (Epolin, Epolight™ 1178) and a cycloolefin polymer (poly[[octahydro-5-(methoxycarbonyl)-5-methyl-4,7-methano-1H-indene-1,3-diyl]-1,2-ethanediyl], Sigma-Aldrich, CAS No. 123322-60-1) are blended in chloroform is spin-coated (3000 rpm, 20 seconds) thereon to form an about 500 nm-thick near-infrared absorbing layer, designing an optical filter.

Evaluation I

An optical simulation with respect to the optical filters according to Example, Comparative Example, and Reference Example is performed by using a FDTD (Finite-different time domain, Lumerical Inc.) software.

Figure 15:
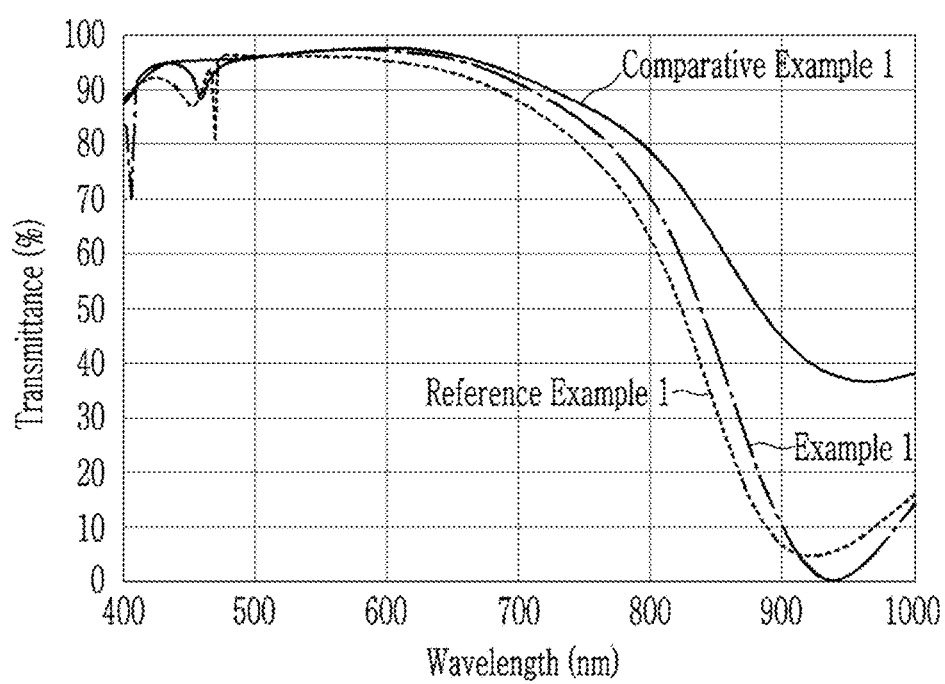
FIG. 15 is a graph showing transmission spectra of the optical filters according to Example 1, Comparative Example 1, and Reference Example 1.
Figure 16:
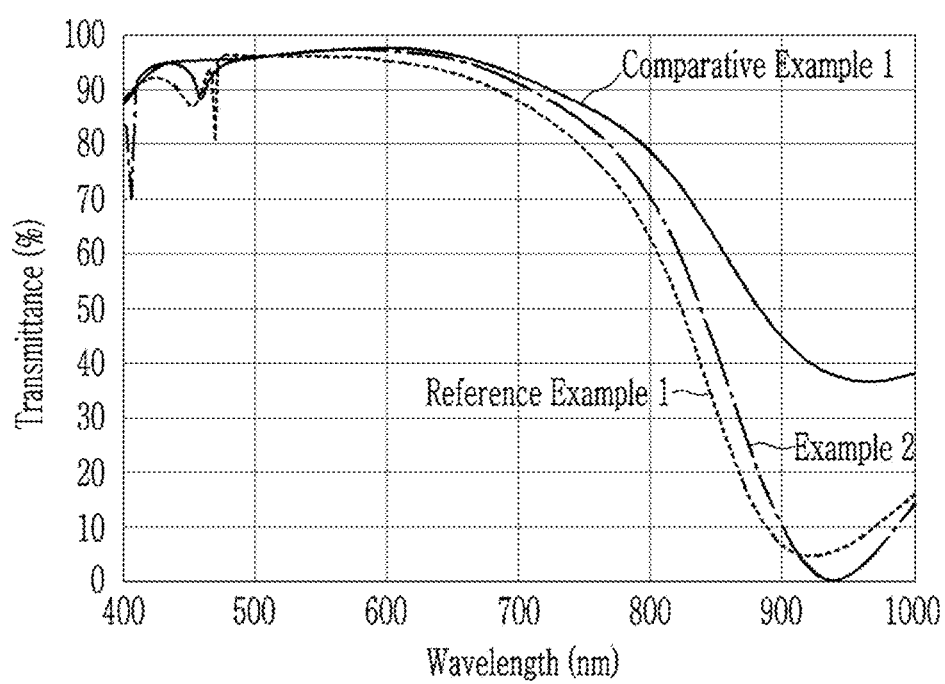
FIG. 16 is a graph showing transmission spectra of the optical filters according to Example 2, Comparative Example 1, and Reference Example 1.

The results are shown in Table 1 and FIG. 15 and FIG. 16.

FIG. 15 is a graph showing transmission spectra of the optical filters according to Example 1, Comparative Example 1, and Reference Example 1 and FIG. 16 is a graph showing transmission spectra of the optical filters according to Example 2, Comparative Example 1, and Reference Example 1.

TABLE 1

|  | $\lambda_{min, T}$ (nm) | $T_{NIR}$ (%) | $T_{VIS}$ (%) | $T_{NIR}/T_{VIS}$ |
|---|---|---|---|---|
| Example 1 | 936 | 4.5 | 95.0 | 0.047 |
| Example 2 | 936 | 5.0 | 95.2 | 0.052 |
| Example 3 | 936 | 5.5 | 95.4 | 0.057 |
| Comparative Example 1 | 962 | 39.1 | 96.0 | 0.407 |
| Comparative Example 2 | 922 | 61.1 | 94.9 | 0.644 |
| Reference Example 1 | 918 | 7.7 | 94.2 | 0.082 |

* $\lambda_{min, T}$: minimum transmission wavelength
* $T_{NIR}$: average transmittance in a near-infrared (890 nm to 990 nm) wavelength spectrum
* $T_{VIS}$: average transmittance in a visible (430 nm to 565 nm) wavelength spectrum
* $T_{NIR}/T_{VIS}$: ratio of the average transmittance in the near-infrared wavelength spectrum to the average transmittance in the visible wavelength spectrum Referring to Table 1, FIGS. 15 and 16, the optical filter according to the Example exhibits high transmittance for a visible light wavelength spectrum (e.g., greater than or equal to about 400 nm and less than about 700 nm, for example about 430 nm to 565 nm) and low transmittance for the near-infrared wavelength spectrum (for example, about 890 nm to 990 nm) compared with the optical filters according to the Comparative Example and the Reference Example. From these results, the optical filter according to the Example exhibits a great improvement effect of the optical characteristics due to the combination of the near-infrared absorbing layer and the metamaterial structures compared with the optical filter according to the Comparative Example and exhibits a greater improvement effect of such optical characteristics than the optical filter according to the Reference Example.

Design of Optical Filter II

Examples 4 to 10

The optical filter is designed in the same manner as in Example 1, except that the thickness of the compensation layer and the diameter of the Ag nanodisks are changed as shown in Table 2.

Evaluation II

An optical simulation with respect to the optical filters according to Example, Comparative Example, and Reference Example is performed by using a FDTD software.

The results are shown in Table 2.

TABLE 2

| | Thickness (nm) of compensation layer | Ag nanodisk diameter (nm) | $\lambda_{min,\,T}$ (nm) | $T_{NIR}$ (%) | $T_{VIS}$ (%) | $T_{NIR}/T_{VIS}$ |
|---|---|---|---|---|---|---|
| Example 4 | 30 | 148 | 940 | 5.0 | 94.3 | 0.053 |
| Example 5 | 40 | 146 | 942 | 4.9 | 94.4 | 0.052 |
| Example 6 | 50 | 140 | 938 | 4.3 | 95.0 | 0.045 |
| Example 7 | 60 | 136 | 938 | 4.3 | 95.0 | 0.045 |
| Example 8 | 70 | 136 | 937 | 4.3 | 95.0 | 0.045 |
| Example 9 | 80 | 132 | 932 | 4.4 | 94.9 | 0.046 |
| Example 10 | 90 | 132 | 934 | 4.4 | 94.9 | 0.046 |
| Comparative Example 1 | 0 | 0 | 962 | 39.1 | 96.0 | 0.407 |
| Comparative Example 2 | 0 | 132 | 922 | 61.1 | 94.9 | 0.644 |
| Reference Example 1 | 0 | 160 | 918 | 7.7 | 94.2 | 0.082 |

\* Ag nanodisk diameter: diameter where $T_{NIR}$ becomes a minimum value

\* $\lambda_{min,\,T}$: minimum transmission wavelength

\* $T_{NIR}$: average transmittance in a near-infrared (890 nm to 990 nm) wavelength spectrum \* $T_{VIS}$: average transmittance in a visible (430 nm to 565 nm) wavelength spectrum \* $T_{NIR}/T_{VIS}$: ratio of the average transmittance in the near-infrared wavelength spectrum to the average transmittance in the visible wavelength spectrum Referring to Table 2, the optical filter according to the Example exhibits high transmittance for a visible light wavelength spectrum (e.g., greater than or equal to about 400 nm and less than about 700 nm, for example about 430 nm to 565 nm) and low transmittance for the near-infrared wavelength spectrum (for example, about 890 nm to 990 nm) compared with the optical filters according to the Comparative Example and the Reference Example. From these results, the optical filter according to the Example exhibits a great improvement effect of the optical characteristics due to the combination of the near-infrared absorbing layer and the metamaterial structures compared with the optical filter according to the Comparative Example and exhibits a greater improvement effect of such optical characteristics than the optical filter according to the Reference Example.

Design of Optical Filter III

Example 11

Ag nanodisks having a diameter of 144 nm and a thickness of 10 nm are dipped into a high refractive index polymer solution having a refractive index of 1.65, dried, and coated with a thickness of about 15 nm to prepare polymer-capped Ag nanodisks. Subsequently, the Ag nanodisks capped with the polymer are disposed on a glass substrate with a surface coverage of 20%. A composition in which 15 wt % of a near-infrared absorbing material (Epolin, Epolight™ 1178) and a cycloolefin polymer (poly[[octahydro-5-(methoxycarbonyl)-5-methyl-4,7-methano-1H-indene-1,3-diyl]-1,2-ethanediyl], Sigma-Aldrich, CAS No. 123322-60-1) are blended in chloroform is spin-coated (3000 rpm, 20 seconds) thereon to form an about 500 nm-thick near-infrared absorbing layer, designing an optical filter (structures of FIGS. 5 and 6).

Evaluation III

An optical simulation is performed with respect to the optical filters according to Example, Comparative Example, and Reference Example by using a FDTD software.

Figure 17:
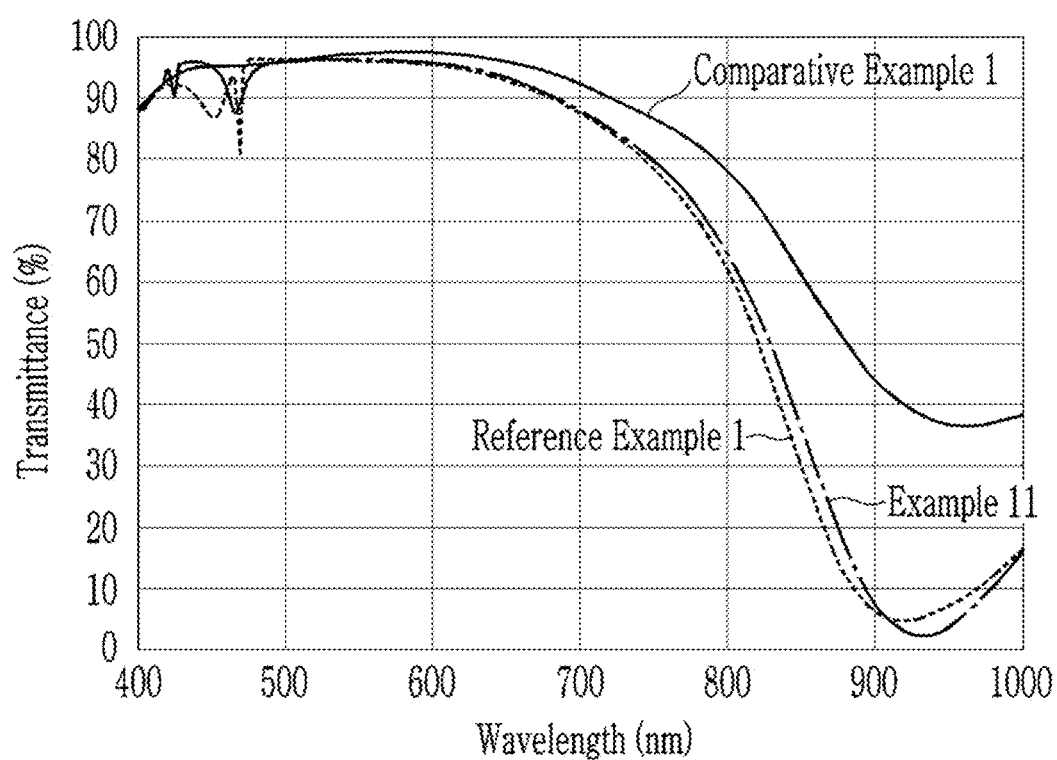
FIG. 17 is a graph showing transmission spectra of the optical filters according to Example 11, Comparative Example 1, and Reference Example 1.

The results are shown in Table 3 and FIG. 17.

FIG. 17 is a graph showing transmission spectra of the optical filters according to Example 11, Comparative Example 1, and Reference Example 1.

TABLE 3

| | $\lambda_{min,\,T}$ (nm) | $T_{NIR}$ (%) | $T_{VIS}$ (%) | $T_{NIR}/T_{VIS}$ |
|---|---|---|---|---|
| Example 11 | 930 | 6.0 | 95.1 | 0.063 |
| Comparative Example 1 | 962 | 39.1 | 96.0 | 0.407 |
| Comparative Example 2 | 922 | 61.1 | 94.9 | 0.644 |
| Reference Example 1 | 918 | 7.7 | 94.2 | 0.082 |

Referring to Table 3 and FIG. 16, the optical filter according to the Example exhibits high transmittance for a visible light wavelength spectrum (e.g., greater than or equal to about 400 nm and less than about 700 nm, for example about 430 nm to 565 nm) and low transmittance for the near-infrared wavelength spectrum (for example, about 890 nm to 990 nm) compared with the optical filters according to the Comparative example and the Reference example.

From these results, the optical filter according to the Example exhibits a great improvement effect of the optical characteristics due to the combination of the near-infrared absorbing layer and the metamaterial structures compared with the optical filter according to the Comparative example and exhibits a greater improvement effect of such optical characteristics than the optical filter according to the Reference Example.

While this disclosure has been described in connection with what is presently considered to be practical example embodiments, it is to be understood that the inventive concepts are not limited to the disclosed example embodiments. On the contrary, it is intended to cover various modifications and equivalent arrangements included within the spirit and scope of the appended claims.

What is claimed is:

1. An optical filter, comprising:
   a near-infrared absorbing layer including a first material, the first material being configured to absorb light in a first wavelength spectrum within a near-infrared wavelength spectrum,
   a compensation layer adjacent to the near-infrared absorbing layer, the compensation layer including a second material different from the first material, and
   a metamaterial structure spaced apart from the near-infrared absorbing layer via the compensation layer, the metamaterial structure being configured to absorb, reflect, and/or scatter light in a second wavelength spectrum at least partially overlapped with the first wavelength spectrum such that the second wavelength spectrum at least partially overlaps the near-infrared wavelength spectrum.

2. The optical filter of claim 1, wherein the metamaterial structure is not in direct contact with the near-infrared absorbing layer.

3. The optical filter of claim 1, wherein
   the compensation layer is at a lower portion, an upper portion, or a side portion of the near-infrared absorbing layer, and
   the metamaterial structure is embedded in the compensation layer.

4. The optical filter of claim 1, wherein the compensation layer surrounds the metamaterial structure.

5. The optical filter of claim 4, wherein the metamaterial structure surrounded by the compensation layer is embedded in the near-infrared absorbing layer.

6. The optical filter of claim 1, wherein the second material is not configured to absorb light in the first wavelength spectrum.

7. The optical filter of claim 1, wherein a maximum extinction coefficient (k) in a wavelength spectrum of about 700 nm to about 1200 nm of the second material is less than about 0.01.

8. The optical filter of claim 1, wherein an average refractive index (n) in a wavelength spectrum of about 700 nm to about 1200 nm of the second material is about 1.4 to about 2.6.

9. The optical filter of claim 1, wherein the second material comprises an oxide, a nitride, an oxynitride, a halide, a sulfide, a chalcogenide, a semiconductor element, a semiconductor compound, an organic material, or any combination thereof.

10. The optical filter of claim 1, wherein a thickness of the compensation layer is about 1.2 times to about 20 times as large as a thickness of the metamaterial structure.

11. The optical filter of claim 1, wherein a thickness ratio of a thickness of the compensation layer to a thickness of the near-infrared absorbing layer is about 1:4 to about 1:50.

12. The optical filter of claim 1, wherein
   a transmission spectrum of the first material includes a first minimum transmission wavelength that is within the first wavelength spectrum,
   a transmission spectrum of the metamaterial structure includes a second minimum transmission wavelength that is within the second wavelength spectrum, and
   the first minimum transmission wavelength and the second minimum transmission wavelength are both within a wavelength spectrum of about 700 nm to about 990 nm.

13. The optical filter of claim 12, wherein a difference between the first minimum transmission wavelength and the second minimum transmission wavelength is less than or equal to about 100 nm.

14. The optical filter of claim 1, wherein a ratio of an average transmittance in the near-infrared wavelength spectrum of the optical filter to an average transmittance in a visible light wavelength spectrum of the optical filter is less than or equal to about 0.07.

15. The optical filter of claim 1, wherein
   an average transmittance in a wavelength spectrum of about 430 nm to 565 nm of the optical filter is greater than about 80%, and
   an average transmittance in a wavelength spectrum of about 700 nm to 800 nm or about 890 nm to 990 nm of the optical filter is less than about 10%.

16. A camera comprising the optical filter of claim 1.

17. An electronic device comprising the camera of claim 16.

18. An image sensor, comprising:
   a semiconductor substrate including a plurality of photodiodes, and
   the optical filter of claim 1 on the semiconductor substrate.

19. The image sensor of claim 18, further comprising a color filter at a lower portion of the optical filter or an upper portion of the optical filter.

20. A camera comprising the image sensor of claim 18.

21. An electronic device comprising the camera of claim 20.

* * * * *